United States Patent
Block et al.

(10) Patent No.: US 7,821,358 B2
(45) Date of Patent: Oct. 26, 2010

(54) ELECTRICAL COMPONENT

(75) Inventors: Christian Block, Stainz (AT);
Alexander Freising, Hart b. Graz (AT);
Christian Korden, Munich (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/271,055

(22) Filed: Nov. 14, 2008

(65) Prior Publication Data

US 2009/0128260 A1 May 21, 2009

Related U.S. Application Data

(63) Continuation of application No. PCT/DE2007/000896, filed on May 15, 2007.

(30) Foreign Application Priority Data

May 15, 2006 (DE) .................. 10 2006 022 580

(51) Int. Cl.
*H03H 9/46* (2006.01)
(52) U.S. Cl. .................. 333/133; 333/193; 333/219
(58) Field of Classification Search .................. 333/132, 333/133, 193, 219
See application file for complete search history.

(56) References Cited

U.S. PATENT DOCUMENTS

| 4,803,449 | A | | 2/1989 | Hikita et al. | |
|---|---|---|---|---|---|
| 5,854,579 | A | | 12/1998 | Penunuri | |
| 5,969,582 | A | * | 10/1999 | Boesch et al. | 333/129 |
| 6,404,302 | B1 | | 6/2002 | Satoh et al. | |
| 6,597,261 | B2 | | 7/2003 | Tsutsumi et al. | |
| 6,747,530 | B1 | | 6/2004 | Selmeier | |
| 6,756,864 | B2 | | 6/2004 | Muramatsu | |
| 6,768,396 | B2 | * | 7/2004 | Klee et al. | 333/187 |
| 6,924,715 | B2 | * | 8/2005 | Beaudin et al. | 333/133 |
| 7,319,850 | B2 | * | 1/2008 | Motoyama | 455/307 |
| 7,583,936 | B2 | * | 9/2009 | Kovacs et al. | 455/78 |
| 2003/0227358 | A1 | | 12/2003 | Inose | |
| 2004/0113719 | A1 | * | 6/2004 | Nakai et al. | 333/133 |
| 2005/0099244 | A1 | | 5/2005 | Nakamura et al. | |
| 2005/0230812 | A1 | | 10/2005 | Przadka | |
| 2006/0067254 | A1 | * | 3/2006 | Mahbub et al. | 370/282 |
| 2006/0192632 | A1 | | 8/2006 | Nakai et al. | |

FOREIGN PATENT DOCUMENTS

| DE | 101 22 007 A1 | 6/2002 |
|---|---|---|
| DE | 102 48 493 A1 | 5/2003 |
| DE | 10 2004 045 179 A1 | 3/2006 |
| DE | 10 2005 051 852 A1 | 5/2007 |
| EP | 1 050 962 A1 | 11/2000 |
| EP | 1 601 112 A1 | 11/2005 |
| JP | 10-65489 | 3/1998 |
| JP | 10-65490 | 3/1998 |
| WO | WO 01/05031 A1 | 1/2001 |
| WO | WO 2004/001963 A1 | 12/2003 |
| WO | WO 2005053172 A1 * | 6/2005 |

* cited by examiner

*Primary Examiner*—Robert Pascal
*Assistant Examiner*—Alan Wong
(74) *Attorney, Agent, or Firm*—Slater & Matsil, L.L.P.

(57) ABSTRACT

An electrical component with a filter circuit is specified that includes a first bandstop filter and a second bandstop filter. The first bandstop filter includes at least one resonator operating with acoustic waves and has a first stop band. The second bandstop filter includes LC elements and has a second stop band that lies at least one octave higher than the first stop band.

19 Claims, 7 Drawing Sheets

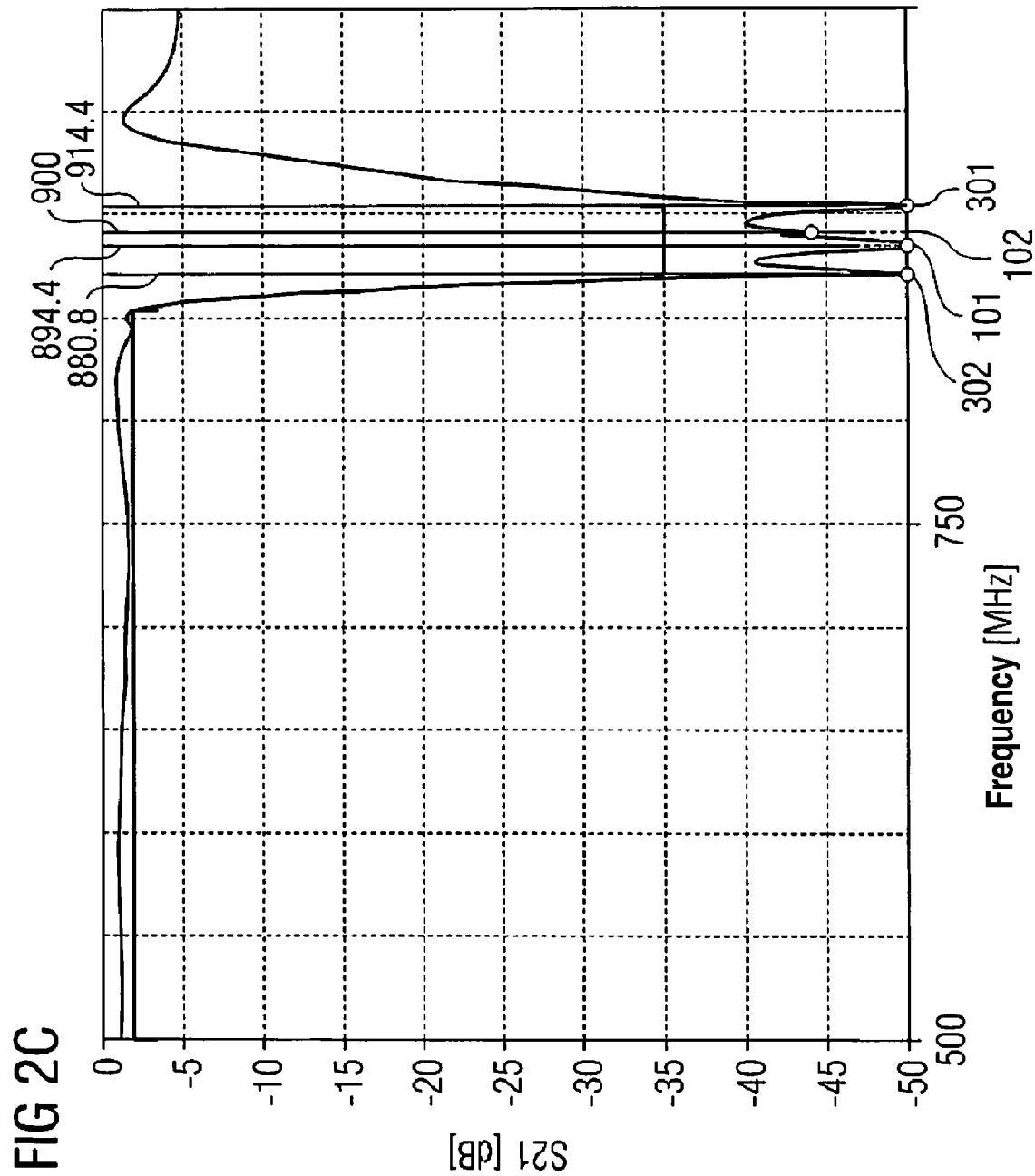

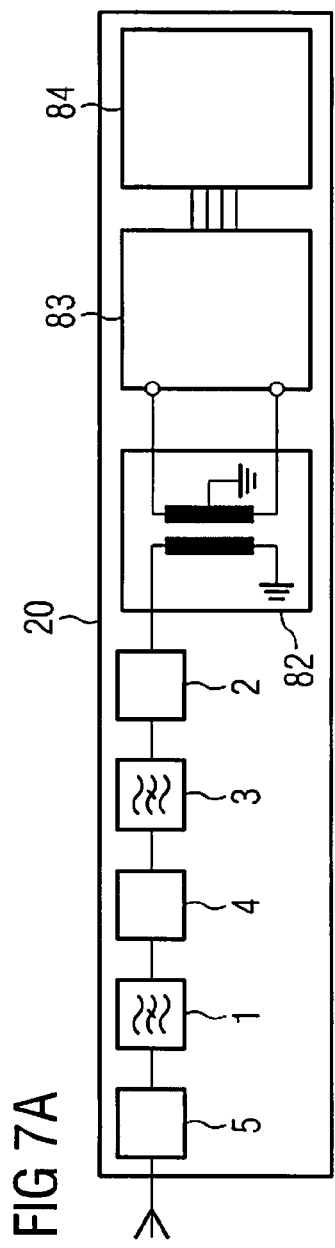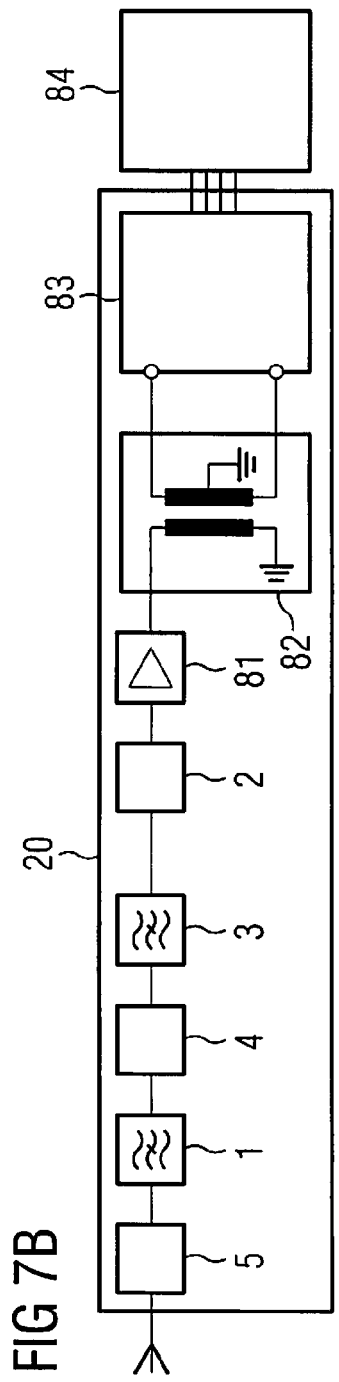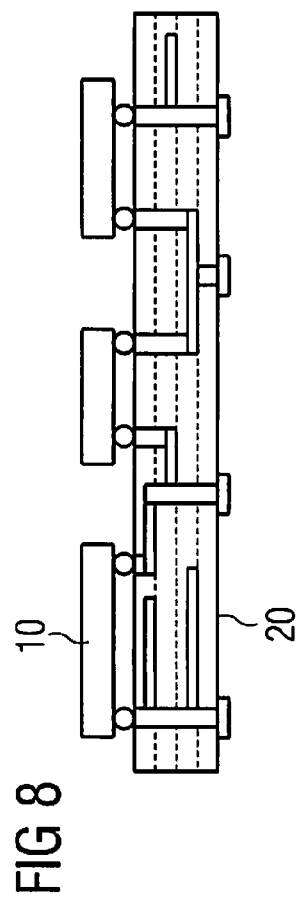

ELECTRICAL COMPONENT

This application is a continuation of co-pending International Application No. PCT/DE2007/000896, filed May 15, 2007, which designated the United States and was not published in English, and which claims priority to German Application No. 10 2006 022 580.5 filed May 15, 2006, both of which applications are incorporated herein by reference.

BACKGROUND

From JP 10065489 A and JP 10065490 A, electrical components with bandstop filters that comprise SAW converters are known. Additional components with SAW converters are known from U.S. Pat. No. 4,803,449 and US 2005/0099244 A1.

SUMMARY

One task to be achieved consists in specifying an electrical component that is suitable for receiving television and multimedia signals and here features a high suppression of interference signals in each data-transmission band.

An electrical component with a filter circuit is specified that comprises a first bandstop filter and a second bandstop filter. The first bandstop filter comprises at least one resonator working with acoustic waves and features a first stop band. The second bandstop filter comprises LC elements and features a second stop band that lies at least one octave higher than the first stop band.

The component is advantageously used in the receive filter of a multimedia data receiver. The multimedia data receiver is advantageously arranged in a multifunctional, portable mobile radio communication device. With the specified component, it is possible to simultaneously guarantee, in the mobile radio communication device, the transmission of mobile radio signals, the transmission of short messages (SMS), and the undisturbed reception of television and multimedia signals.

Television reception is enabled in a frequency band between 470 MHz and 862 MHz (UHF band). Certain channels that lie in this frequency band can be used, in particular, in mobile radio communication devices for the reception of digital multimedia data, such as, e.g., DVB-H. DVB-H stands for Digital Video Broadcasting for Handhelds. The mobile radio data can be transmitted in one of the following bands: GSM900 (880 . . . 960 MHz), GSM1800 (1710 . . . 1880 MHz), UMTS (1920 . . . 2170 MHz). The transmission power in the transmission of the mobile radio signals lies, as a rule, between 20 and 35 dBm. To be able to guarantee a simultaneous, non-noisy reception of multimedia data, the transmission signals are suppressed by the filter circuit of specified components, advantageously by at least 35 dB. The desired filter characteristics can be achieved, in particular, by an advantageous combination of resonators operating with acoustic waves and LC elements arranged in the second bandstop filter.

The acoustic resonator can be a resonator operating with surface acoustic waves, SAW resonator, that has an interdigital converter. SAW stands for Surface Acoustic Wave. The interdigital converter is advantageously arranged between two acoustic reflectors. Electrodes of the converter and reflector structures engaging each other are advantageously arranged on a piezoelectric substrate.

The acoustic resonator can also be a resonator operating with bulk acoustic waves, BAW resonator, that has a piezoelectric layer arranged between two electrode layers. BAW stands for Bulk Acoustic Wave. BAW resonators are distinguished by an especially high power resistance.

The first bandstop filter can have an arbitrary combination of resonators constructed using SAW and BAW technology.

The filter circuit has a pass band, e.g., in a frequency range between 470 and 869 MHz, in which signals are attenuated only slightly advantageously by 0-2 dB. The first stop band advantageously lies next to the pass band, e.g., in the frequency range 890-915 MHz. In the first stop band, signals are advantageously attenuated by at least 35 dB.

With the second bandstop filter, it is possible to achieve a relatively high far-off selectivity (flyback) of the component, e.g., at frequencies above 1700 MHz.

The filter circuit comprises, in an advantageous variant, a third bandstop filter that comprises at least one resonator operating with acoustic waves and a third stop band that advantageously lies next to the first stop band. The first and third stop bands advantageously lie within an octave.

The first bandstop filter advantageously arranged in front of the third bandstop filter is realized, in one advantageous variant, using BAW technology. The third bandstop filter can also be realized using BAW technology or alternatively using SAW technology.

The bandstop filters are advantageously notch filters that block a resonance frequency of the resonator. The bandstop filter can comprise at least one series resonator arranged in a signal path. At the parallel resonance of the series resonator, the signal path is blocked. The bandstop filter can also comprise at least one parallel resonator arranged in a shunt arm. At the series resonance of the parallel resonator, the signal path is blocked because signals are led to ground.

The bandstop filter can also comprise a series resonator and a parallel resonator. These resonators advantageously form a member of a bandstop ladder-type arrangement. Advantageously, the series resonance of the parallel resonator essentially matches the parallel resonance of the series resonator.

In one variant, the second bandstop filter comprises a shunt arm connected to ground that comprises a series resonant circuit with an inductive resistor and a capacitor, wherein the resonance frequency of the series resonant circuit lies in the given second stop band.

In another variant, the second bandstop filter comprises a series branch arranged in the signal path with a parallel resonant circuit that comprises a parallel circuit of an inductive resistor and a capacitor. The resonance frequency of the parallel resonant circuit lies in the given second stop band.

The quality factor of the inductive resistor advantageously equals at least 40 at 800 MHz.

A buffer circuit that comprises at least one circuit element selected from an inductive resistor and a capacitor can be arranged between the first and third bandstop filters. This buffer circuit can function as the second bandstop filter.

The first bandstop filter is advantageously arranged in front of the third bandstop filter. The second bandstop filter can be arranged, according to the configuration, in front of the first bandstop filter, behind the third bandstop filter, or, as already mentioned, between the first and the third bandstop filters.

A filter circuit that comprises at least one LC circuit in addition to the first, second, and third bandstop filters, is considered especially advantageous. However, the filter circuit can also comprise two or more LC circuits arranged on the input side, on the output side, or between the bandstop filters. The LC circuit arranged on the input side is advantageously used for matching the input impedance of the filter circuit to the impedance of the upstream components (e.g., antenna). The LC circuit arranged on the output side is advantageously used for matching the output impedance of the filter circuit to the impedance of the downstream components (e.g., preamplifier). The LC circuit (buffer circuit) arranged between the bandstop filters is used, among other things, as a matching element for matching the impedance of the acoustic resonators used in the bandstop filters.

At least one circuit element selected from an inductive resistor and a capacitor belongs to the elements of the LC circuits. The elements of the LC circuits can be arranged in the signal path or in a shunt arm connected to ground. The LC circuits can each be realized as a filter, in particular, a bandpass filter, a low-pass filter, or a high-pass filter.

Each acoustic resonator comprises, in the equivalent circuit diagram, a series resonator circuit and a parallel resonator circuit. By means of the elements of the LC circuits connected to the corresponding resonator, there is the ability to expand these resonant circuits and thus to influence their resonance frequency.

The series resonance of a parallel resonant circuit that comprises a parallel resonator arranged in the shunt arm and also the parallel resonance of a series resonant circuit that comprises a series resonator arranged in the signal path can lead to a zero point in the transfer function of the filter circuit. The elements of the LC circuits including the second bandstop filter and the buffer circuit can be used in such resonant circuits, in order to obtain the zero points in the transfer function of the filter circuit. Therefore, a zero point of the transfer function can be set at a desired frequency that advantageously lies in the mobile radio band, so that the mobile radio signals can be efficiently suppressed.

BRIEF DESCRIPTION OF THE DRAWINGS

Below, advantageous configurations of the component will be explained with reference to schematic figures that are not true to scale.

FIG. 2C shows the transfer function of the filter circuit according to FIG. 2B;

FIGS. 7A, 7B each show the equivalent circuit diagram of a component with high integration;

FIG. 8 shows in cross section an electrical component with a carrier substrate and a chip arranged on this substrate;

Figure 1:
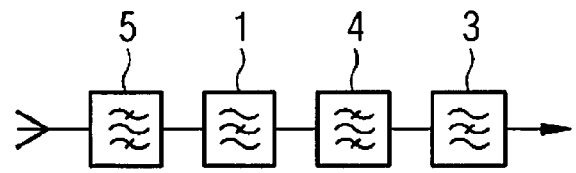
FIG. 1 shows an example filter circuit with two bandstop filters and two LC filters.

The following is a list of reference symbols which can be used in conjunction with the drawings:

1 First bandstop filter

2 Second bandstop filter

3 Third bandstop filter

4 Buffer circuit

5 LC filter

9 Additional bandstop filter with an acoustic resonator

10 Chip

11 Series resonator

12 Parallel resonator

20 Carrier substrate

31 Series resonator

32 Parallel resonator

61, 62 LC circuit

71, 72 LC circuit in the shunt arm

81 Preamplifier

82 Balun

83 Receiver IC (tuner)

84 Circuit for processing multimedia data

100 Pass band of the filter circuit

101, 102 First zero points

201 Stop band of the second bandstop filter

301, 302 Third zero points

DETAILED DESCRIPTION

FIG. 1 shows a filter circuit arranged in a receive path. The filter circuit comprises a first bandstop filter 1, a third bandstop filter 3, a buffer circuit 4 arranged between the bandstop filters 1, 3 and an LC circuit 5 on the input side.

Figure 2B:
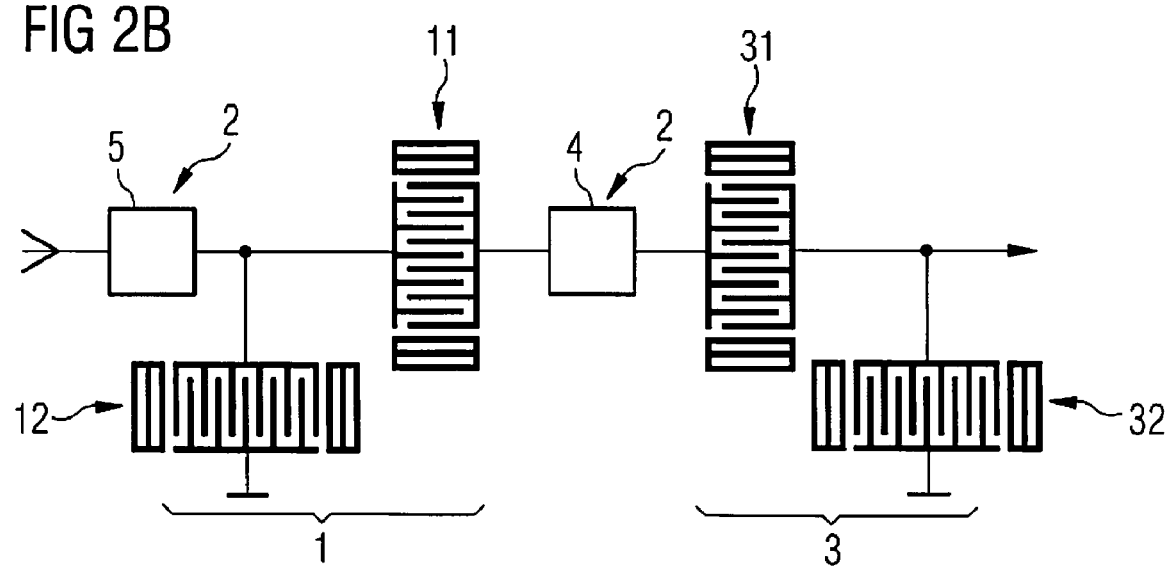
FIG. 2B shows a realization of the filter circuit according to FIG. 2A with SAW converters in the first and third bandstop filters.
Figure 3A:
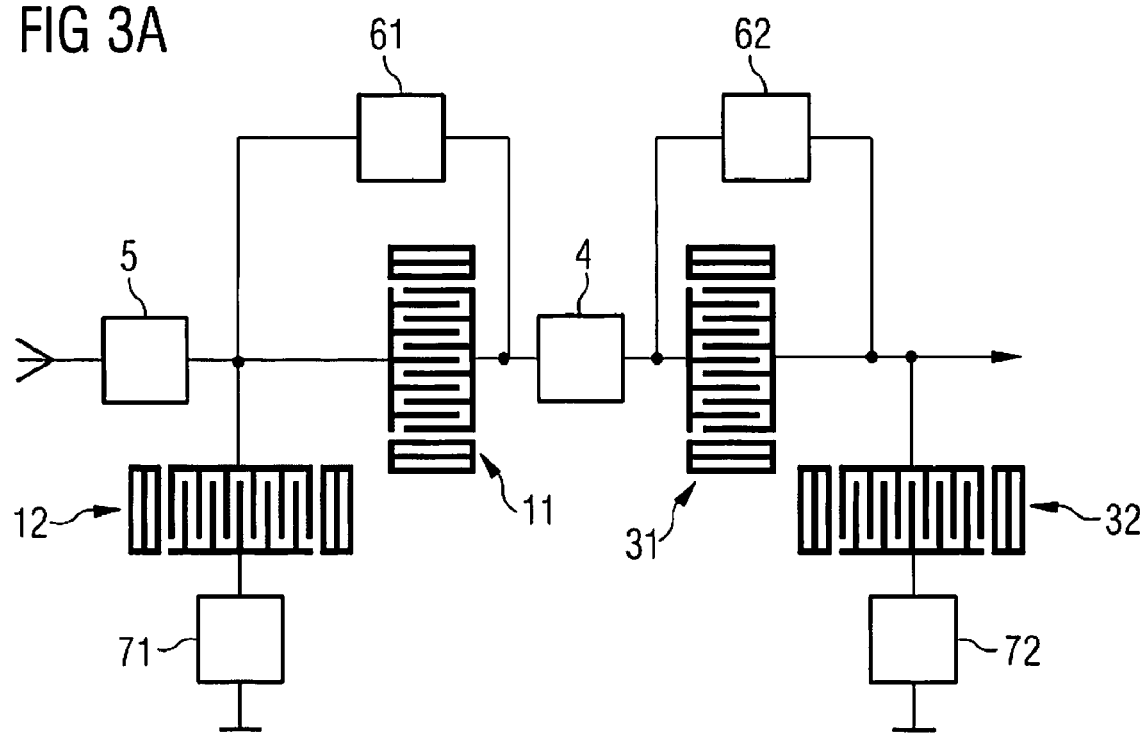
FIG. 3A shows a filter circuit with SAW converters and several LC circuits.
Figure 3B:
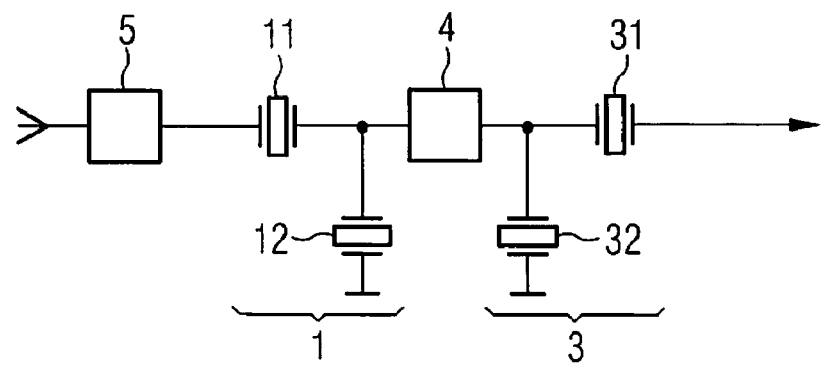
FIG. 3B shows a realization of the filter circuit according to FIG. 2A with BAW converters in the first and third bandstop filters.

Each bandstop filter 1, 3 comprises at least one resonator that operates with acoustic waves. Such resonators are shown in FIGS. 2B, 3A, and 3B.

The LC circuit 5 is constructed as a bandpass filter in the variant according to FIG. 1. In addition, the LC circuit 5 is advantageously provided as a matching circuit for matching the input impedance of the filter circuit to a given standard impedance (e.g., 50 Ohm).

The buffer circuit 4 that also comprises an LC circuit is here constructed as a bandpass filter that is used advantageously as a matching element. The circuits 4, 5 can each comprise a high-pass filter or a low-pass filter instead of a bandpass filter shown in FIG. 1.

A cutoff frequency (or zero point) of the filter circuit depends primarily on the respective bandstop filter and also on the circuits connected directly to the filter. For setting first cutoff frequencies 101, 102 of the filter circuit, the first bandstop filter 1 and also at least one element of the circuits 4 and/or 5 connected to the filter are important. For setting third cutoff frequencies 301, 302 of the filter circuit, the third bandstop filter 3 and also at least one element of the circuit 4 connected to this filter are important.

Figure 2A:
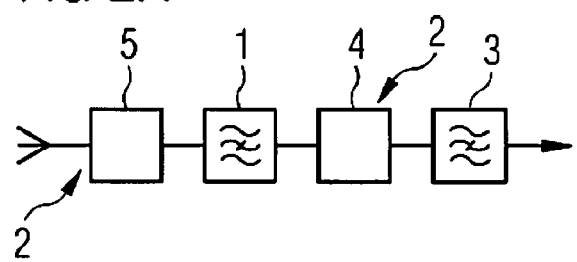
FIG. 2A shows a filter circuit with two bandstop filters, an LC circuit arranged on the input side, and a buffer circuit that comprises LC elements.

FIG. 2A shows a filter circuit that has an arbitrary LC circuit 5 instead of the input-side bandpass filter shown in FIG. 1. In contrast to the variant according to FIG. 1, here the buffer circuit 4 and/or the LC circuit 5 is provided as the second bandstop filter 2.

The LC circuit 5, the bandstop filters 1, 3, and the buffer circuit 4 are connected in series. The component can also comprise additional circuit blocks provided as in FIGS. 4A, 6A as components of the filter circuit or as in FIGS. 5, 6B, 6C, 7A, 7B as additional function blocks. These circuit blocks are advantageously also arranged in the signal path. The sequence of mentioned components of the filter circuit can be, in principle, arbitrary.

The circuits 4, 5 can each comprise at least one of the following circuit elements: a series capacitor, a parallel capacitor, a series inductive resistor, a parallel inductive resistor, and a strip line.

The first bandstop filter 1 is realized in the variant according to FIG. 2B as a ladder-type element with a series resonator 11 and a parallel resonator 12. The third bandstop filter 3 is also realized as a ladder-type element with a series resonator 31 and a parallel resonator 32.

The transfer function of the filter circuit according to FIG. 2B is shown in FIG. 2C. The filter circuit is characterized in that it features a pass band in the frequency range between 470 and 862 MHz and a first stop band in the frequency range between 880 and 915 MHz. Here, the series resonator 11 generates a zero point 101 at ca. 894, MHz and the parallel resonator 12 generates a zero point 102 at ca. 900 MHz. The series resonator 31 generates a zero point 301 at ca. 914 MHz, and the parallel resonator 32 generates a zero point 302 at ca. 881 MHz.

In the pass band the insertion attenuation of the filter circuit shown in FIG. 2B does not exceed the value of −1.3 dB. The attenuation of transmission signals in the GSM900 band is here better than the given level of −40 dB.

In FIG. 3A, a variant of the filter circuit presented in FIG. 2B is shown. In this case, in addition to the circuits 4, 5, additional LC circuits 61, 62, 71, 72 are provided.

The LC circuit 61 is connected parallel to the series resonator 11, and the LC circuit 62 is connected parallel to the series resonator 31. The LC circuit 71 is connected in series with the parallel resonator 12, and the LC circuit 72 is connected in series with the parallel resonator 32.

The LC circuits 61, 62 connected in parallel to the resonators advantageously each comprise a capacitor. The LC circuits 71, 72 connected in series to the resonators advantageously each comprise an inductive resistor. The LC circuits 61, 62, 71, 72 can also each comprise an arbitrary combination of inductive resistors and capacitors, in particular, a series resonator circuit or a parallel resonator circuit.

Another filter circuit is shown in FIG. 3B. The resonators 11, 12, 31, 32 shown in FIG. 3B can be BAW resonators or SAW resonators as in FIG. 2B. In contrast to FIG. 2B, for the first bandstop filter 1, the series resonator 11 is connected in front of the parallel resonator 12 and for the third bandstop filter 3, the series resonator 31 is connected after the parallel resonator 32.

Figure 4A:
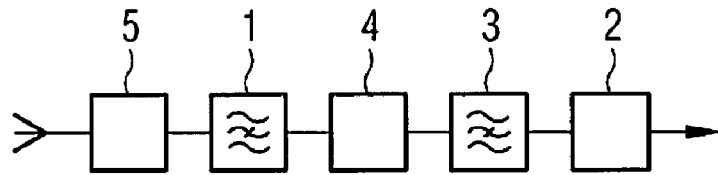
FIG. 4A shows a filter circuit with three bandstop filters, a buffer circuit comprising LC elements, and a LC circuit arranged on the input side.

In FIG. 4A, a filter circuit is shown expanded by another LC circuit relative to the circuit shown in FIG. 2A. This LC circuit arranged on the output side is advantageously the second bandstop filter 2, while the circuits 4, 5 each comprise, e.g., a bandpass filter, a low-pass filter, or a high-pass filter. Advantageously, the second bandstop filter 2 comprises a shunt arm with a series resonator circuit that has an inductive resistor and a capacitor connected in series to this inductive resistor. The resonance frequency of the series resonator circuit or the stop band of the second bandstop filter 2 is advantageously selected so that it lies in the second stop band 201 of the filter circuit that lies higher by at least one octave than the first stop band (880-915 MHz) of the filter circuit.

Figure 4B:
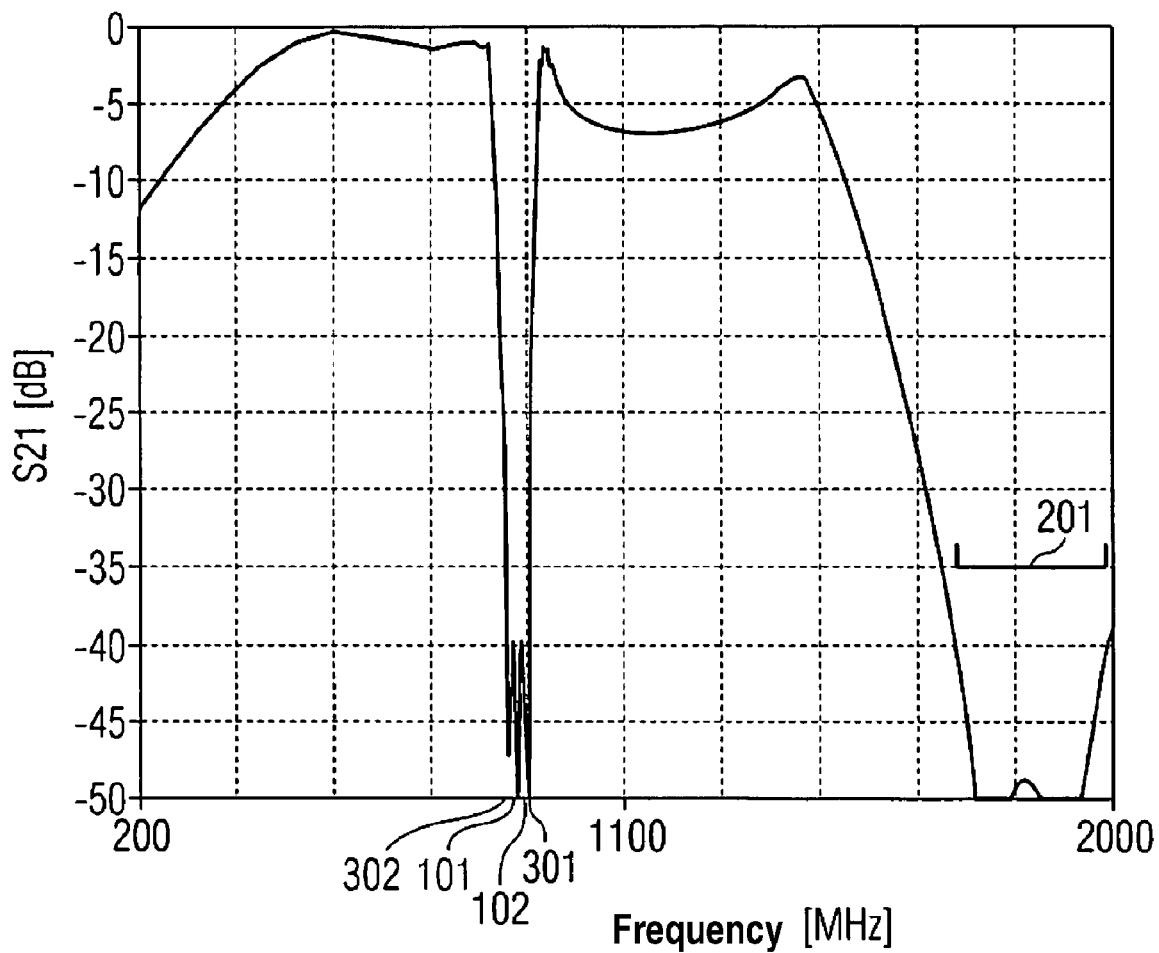
FIG. 4B shows the transfer function of the filter circuit according to FIG. 4A.

The transfer function of the filter circuit according to FIG. 4A is shown in FIG. 4B. With this filter circuit, it is possible to achieve a suppression of the transmission signals of the radio bands GSM1800 and UMTS of at least 35 dB.

Figure 9:
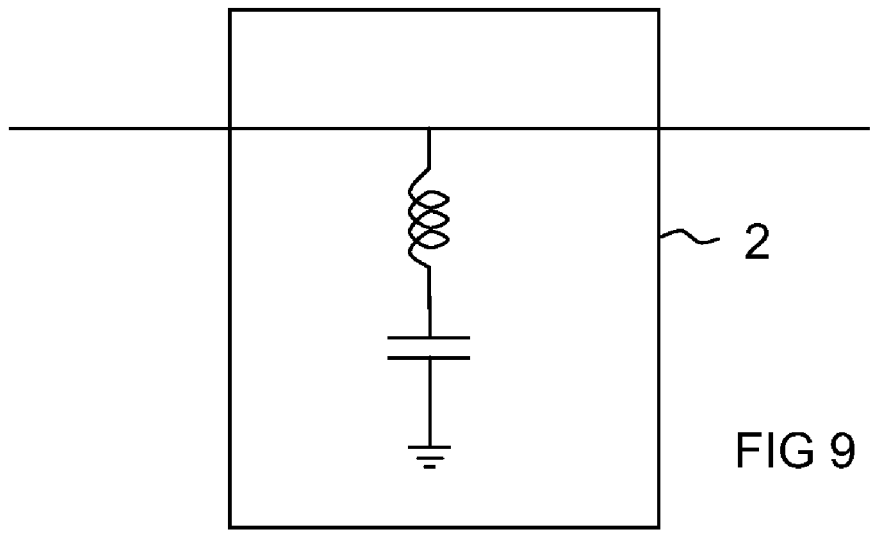
FIG. 9 shows a second band stop filter that has a shunt arm coupled to ground.
Figure 10:
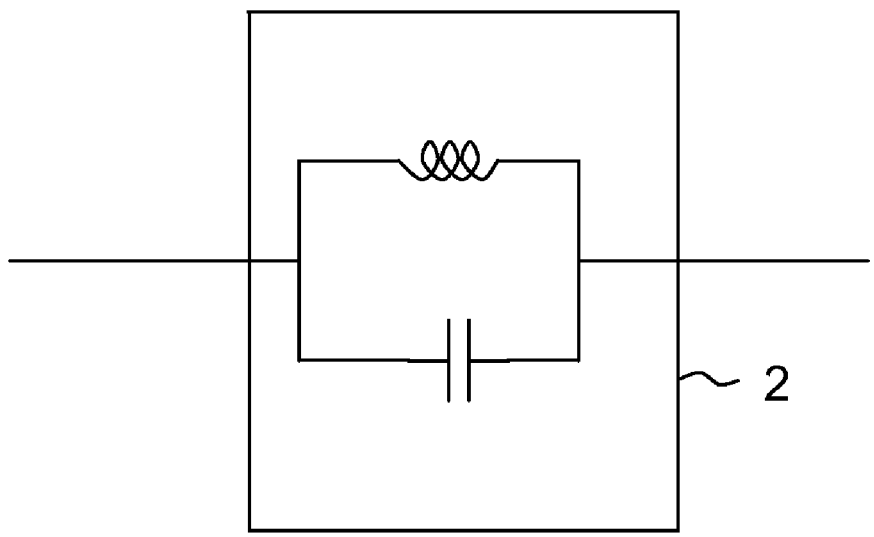
FIG. 10 shows a second band stop filter having a series branch.

Examples for the second band stop filter 2 are shown in FIGS. 9 and 10. FIG. 9 illustrates the second band stop filter 2 having a shunt arm coupled to ground. The shunt arm comprises a series resonator circuit with an inductive resistor and a capacitor. FIG. 10 illustrates the second band stop filter 2 comprising a series branch arranged in a signal path that comprises a parallel resonator circuit with an inductive resistor and a capacitor.

Figure 5:
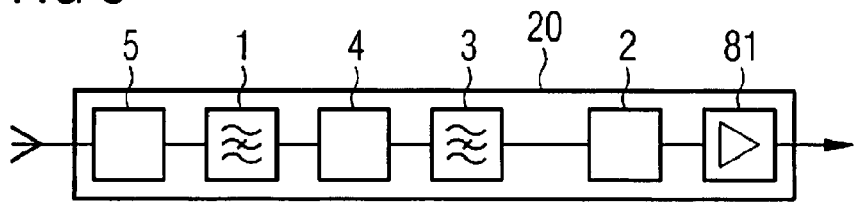
FIG. 5 shows the equivalent circuit diagram of a component with the filter circuit according to FIG. 4A and a preamplifier arranged behind the filter circuit.

In FIG. 5, a component is shown that comprises a preamplifier 81 in addition to the filter circuit explained in connection with FIG. 4A. With a solid line in the form of a rectangle, in FIG. 5 and the subsequent figures, it is indicated that the circuit blocks 1, 2, 3, 4, 5, 81, 82 of the component are integrated in a module explained in more detail in FIG. 8.

Figure 6A:
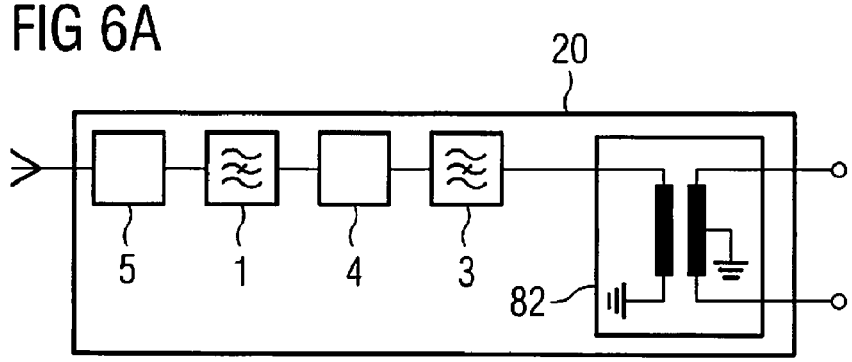
FIG. 6A shows the equivalent circuit diagram of a component with the filter circuit according to FIG. 2A and a balun arranged behind the filter circuit.

In the embodiment according to FIG. 6A, a symmetry element (balun) 82 is arranged after the filter circuit explained in connection with FIG. 2A. The balun 82 can also be provided for an impedance transformation. In particular, by means of the balun, the output impedance of the filter circuit, e.g., of 50 Ohm, can be changed to 200 Ohm or another reference impedance. A balun of the Marchand type that comprises conductors and optionally LC components is considered especially advantageous because it can be easily integrated into a carrier substrate 20 (FIG. 8).

Figure 6B:
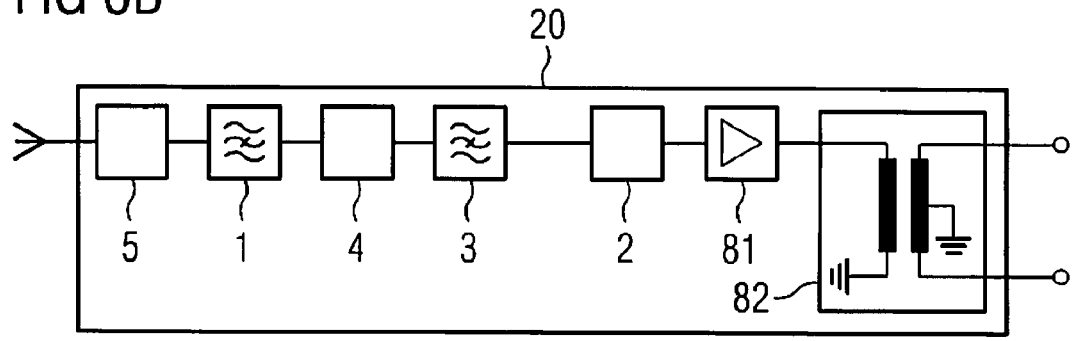
FIG. 6B shows the equivalent circuit diagram of a component with the filter circuit according to FIG. 4A, a preamplifier, and a balun.

Between the third bandstop filter 3 and the balun 82, the second bandstop filter 2 and optionally the preamplifier 81 can be arranged, see FIG. 6B. The arrangement of the preamplifier 81 in front of the balun 82, advantageously between the filter circuit 1, 2, 3, 4, 5, and the balun 82, is especially advantageous with respect to the reduction of the noise figure of the receive system realized in the component. There is the ability to arrange an LC circuit, in particular, the second bandstop filter 2, behind the preamplifier 81. Through the arrangement of circuit blocks behind the preamplifier, the overall insertion attenuation of the component can be kept small.

Figure 6C:
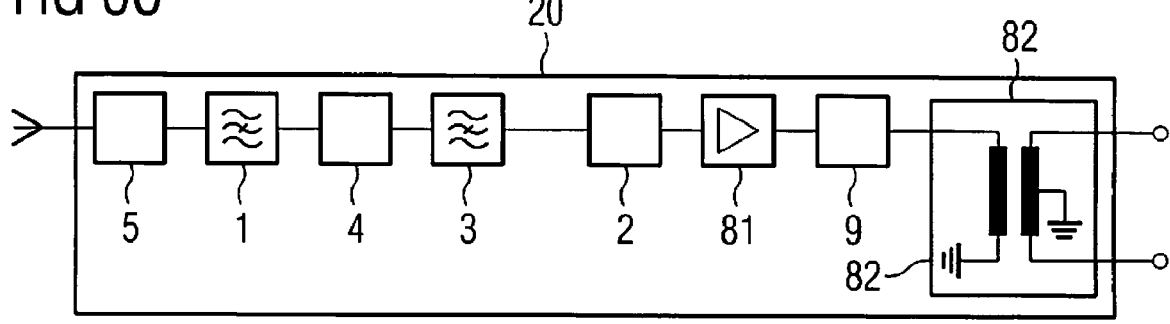
FIG. 6C shows a variant of the component according to FIG. 6B with an additional LC circuit.

Behind the preamplifier 81, at least one additional bandstop filter 9 can be arranged that comprises at least one resonator operating with acoustic waves, see FIG. 6C.

The module advantageously comprises a carrier substrate 20 and at least one chip 10 arranged on this substrate, see FIG. 8. As the carrier substrate 20, for example, a multilayer substrate on the basis of an LTCC ceramic is suitable. LTCC stands for Low Temperature Cofired Ceramics. Between the ceramic layers, circuit elements in the form of conductor surfaces and conductor track sections are allocated, e.g., to the second bandstop filter. An integrated inductive resistor can be formed here by an elongated, optionally folded conductor track. An integrated capacitor can be formed by opposing conductor surfaces and the area of the ceramic layer lying in-between. In the carrier substrate 20, advantageously the wiring is also realized between various functional blocks of the component. The second bandstop filter and the buffer circuit are advantageously completely integrated in the carrier substrate 20.

The chip advantageously comprises a piezoelectric substrate with metal strips arranged on this substrate and allocated to an electro-acoustic converter or to an acoustic reflector. The chip can also comprise a base substrate on which BAW resonators are arranged.

The carrier substrate 20 is suitable, in particular, as a carrier for semiconductor components. On the carrier substrate, at least one other chip can be arranged in which a circuit is integrated, selected from a balun, a low-noise amplifier, a semiconductor switch, and an integrated receiver circuit. The balun can also be arranged in the carrier substrate.

The use of the balun is especially preferred in the embodiments according to FIGS. 7A and 7B, because highly integrated receive components 83 and 84 realized using SiGe or CMOS technology are designed, as a rule, for symmetric signal processing.

The first receive component 83 comprises a tuner. The second receive component 84 comprises a so-called baseband filter. This is, for example, a circuit for processing multimedia signals. The baseband filter can be a component of the module, as indicated in FIG. 7A. Alternatively, the baseband filter can be realized as indicated in FIG. 7B in another component and can be connected to the module.

The preamplifier 81 can be an individual transistor. The preamplifier 81 can also be provided in the form of an integrated circuit (MMIC). MMIC stands for Monolithic Microwave Integrated Circuit. MMIC advantageously comprises at least one circuit suitable for stabilizing the operating point of semiconductor components (transistors). The preamplifier 81 can be an SMD component or a wired component advantageously constructed as a monolithic chip. SMD stands for Surface Mounted Device.

The entire module can also be constructed as an SMD component or a wired component. The chips are advantageously encapsulated by a sealing compound. The chips can also be covered by a cap that closes against the top side of the carrier substrate. The cap can be made from a metal plate suitable for electromagnetic shielding of the chips. The cap can also comprise an advantageously dimensionally stable electrically insulating material metalized in one variant for the purpose of electromagnetic shielding of the chip.

What is claimed is:

1. An electrical component comprising:
a filter circuit that comprises a first bandstop filter coupled in series to a second bandstop filter in a single signal path;
wherein the first bandstop filter comprises at least one resonator operating with acoustic waves and a first stop band,
wherein the second bandstop filter comprises LC elements and a second stop band that lies at least one octave higher than the first stop band,
wherein one of the first band stop filter or the second band stop filter comprises a parallel resonator arranged in a shunt arm, and
wherein blocked signals are led to ground at a series resonance of the parallel resonator.

2. The component according to claim 1, wherein the filter circuit has a pass band and wherein the first stop band lies next to the pass band.

3. The component according to claim 1, wherein the filter circuit comprises a third bandstop filter that comprises at least one resonator operating with acoustic waves and has a third stop band, wherein the first stop band and the third stop band lie next to each other.

4. The component according to claim 3, wherein the filter circuit comprises a buffer circuit arranged between the first and the third bandstop filter, the buffer circuit comprising an inductive resistor and/or a capacitor.

5. The component according to claim 1, wherein the first bandstop filter has a first resonator in a series branch.

6. The component according to claim 1, wherein the first bandstop filter has a second resonator in a shunt arm.

7. The component according to claim 1, wherein the second bandstop filter comprises a shunt arm coupled to ground, the shunt arm comprising a series resonator circuit with an inductive resistor and a capacitor, wherein the series resonator circuit has a resonance frequency that lies in the second stop band.

8. The component according to claim 1, wherein the second bandstop filter comprises a series branch arranged in a signal path the signal path that comprises a parallel resonator circuit with an inductive resistor and a capacitor, wherein a resonance frequency of the parallel resonator circuit lies in the second stop band.

9. The component according to claim 1, wherein the single signal path comprises a receive path of the component, the filter circuit being arranged in the receive path.

10. The component according to claim 1, wherein the second bandstop filter is integrated in a carrier substrate on which a chip is arranged, the chip having the at least one resonator operating with acoustic waves.

11. The component according to claim 10, further comprising at least one additional chip, arranged on the carrier substrate, the at least one additional chip comprising a circuit selected from the group consisting of a balun, a low-noise amplifier, a semiconductor switch, and an integrated receiver circuit.

12. An electrical component comprising:
a filter circuit that comprises a first bandstop filter coupled to a second bandstop filter;
wherein the first bandstop filter comprises at least one resonator operating with acoustic waves and a first stop band;
wherein the second bandstop filter comprises LC elements and a second stop band that lies at least one octave higher than the first stop band;
wherein the filter circuit comprises a third bandstop filter that comprises at least one resonator operating with acoustic waves and has a third stop band, wherein the first stop band and the third stop band lie next to each other,
wherein one of the band stop filters comprises at least one parallel resonator arranged in a shunt arm, and
wherein blocked signals are led to ground at a series resonance of the parallel resonator.

13. The component according to claim 12, wherein the filter circuit has a pass band and wherein the first stop band lies next to the pass band.

14. The component according to claim 12, wherein the first bandstop filter has a first resonator in a series branch.

15. The component according to claim 12, wherein the first bandstop filter has a second resonator in a shunt arm.

16. The component according to claim 12, wherein the second bandstop filter comprises a shunt arm coupled to ground, the shunt arm comprising a series resonator circuit with an inductive resistor and a capacitor, wherein the series resonator circuit has a resonance frequency that lies in the second stop band.

17. The component according to claim 12, wherein the second bandstop filter comprises a series branch arranged in a signal path that comprises a parallel resonator circuit with an inductive resistor and a capacitor, wherein a resonance frequency of the parallel resonator circuit lies in the second stop band.

18. The component according to claim 12, wherein the filter circuit comprises a buffer circuit arranged between the first and the third bandstop filter, the buffer circuit comprising an inductive resistor and/or a capacitor.

19. The component according to claim 12, wherein the filter circuit is arranged in a receive path of the component.

* * * * *

UNITED STATES PATENT AND TRADEMARK OFFICE
CERTIFICATE OF CORRECTION

PATENT NO. : 7,821,358 B2 Page 1 of 1
APPLICATION NO. : 12/271055
DATED : October 26, 2010
INVENTOR(S) : Block et al.

It is certified that error appears in the above-identified patent and that said Letters Patent is hereby corrected as shown below:

In Col. 8, lines 8-9, claim 8, after in delete "a signal path".

Signed and Sealed this

Seventh Day of December, 2010

David J. Kappos
*Director of the United States Patent and Trademark Office*